United States Patent
Chiu et al.

(10) Patent No.: US 9,508,896 B2
(45) Date of Patent: Nov. 29, 2016

(54) LIGHT EMITTING DIODE CHIP AND METHOD OF MANUFACTURING SAME

(71) Applicant: ADVANCED OPTOELECTRONIC TECHNOLOGY, INC., Hsinchu Hsien (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONICS TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/736,778

(22) Filed: Jun. 11, 2015

(65) Prior Publication Data

US 2016/0079469 A1    Mar. 17, 2016

(30) Foreign Application Priority Data

Sep. 12, 2014   (CN) .......................... 2014 1 0463095

(51) Int. Cl.
| | |
|---|---|
| *H01L 33/08* | (2010.01) |
| *H01L 33/06* | (2010.01) |
| *H01L 33/00* | (2010.01) |
| *H01L 33/24* | (2010.01) |
| *H01L 33/32* | (2010.01) |
| *H01L 33/18* | (2010.01) |

(52) U.S. Cl.
CPC ............. *H01L 33/06* (2013.01); *H01L 33/007* (2013.01); *H01L 33/08* (2013.01); *H01L 33/24* (2013.01); *H01L 33/32* (2013.01); *H01L 33/18* (2013.01)

(58) Field of Classification Search
CPC ............................... H01L 33/08; H01L 33/24
See application file for complete search history.

(56) References Cited

U.S. PATENT DOCUMENTS

2013/0069035 A1    3/2013  Kikuchi et al.
2013/0320299 A1*  12/2013  Li ......................... H01L 33/06
                                                                257/13

FOREIGN PATENT DOCUMENTS

TW          200637028 A      10/2006
TW          201316548 A       4/2013

* cited by examiner

*Primary Examiner* — Benjamin Sandvik
*Assistant Examiner* — Leslie Pilar Cruz
(74) *Attorney, Agent, or Firm* — Zhigang Ma (57) ABSTRACT

A light emitting diode (LED) chip includes a first semiconductor layer, a first light emitting layer formed on the first semiconductor layer, a second light emitting layer formed on the first light emitting layer, and a second semiconductor layer formed on the second light emitting layer. The first light emitting layer emits light having a first color. The second light emitting layer emits light having a second color different from the first color.

17 Claims, 7 Drawing Sheets

LIGHT EMITTING DIODE CHIP AND METHOD OF MANUFACTURING SAME

CROSS-REFERENCE TO RELATED APPLICATIONS

This application claims priority to Chinese Patent Application No. 201410463095.0 filed on Sep. 12, 2014 in the China Intellectual property Office, the contents of which are incorporated by reference herein.

FIELD

The subject matter herein generally relates to a light emitting diode (LED) chip and manufacturing method thereof.

BACKGROUND

An LED generally exits white light by the following ways: a first way is that providing a blue LED chip and yellow phosphor enclosing the blue LED chip, blue light emitting from the blue LED chip exciting the yellow phosphor; a second way is arranging a red LED chip, a green LED chip and a blue LED chip coupled with a circuit, light from the red LED chip, the green LED chip and the blue LED chip to be mixed to exit a white light. However, in the first way, the white light has a color different between a center and a periphery thereof. In the second way, the red light, the green light and the blue light are generally mixed inadequately.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. The description is not to be considered as limiting the scope of the embodiments described herein.

A definition that applies throughout this disclosure will now be presented. The term "comprising" means "including, but not necessarily limited to"; it specifically indicates open-ended inclusion or membership in a so-described combination, group, series and the like.

Figure 1:
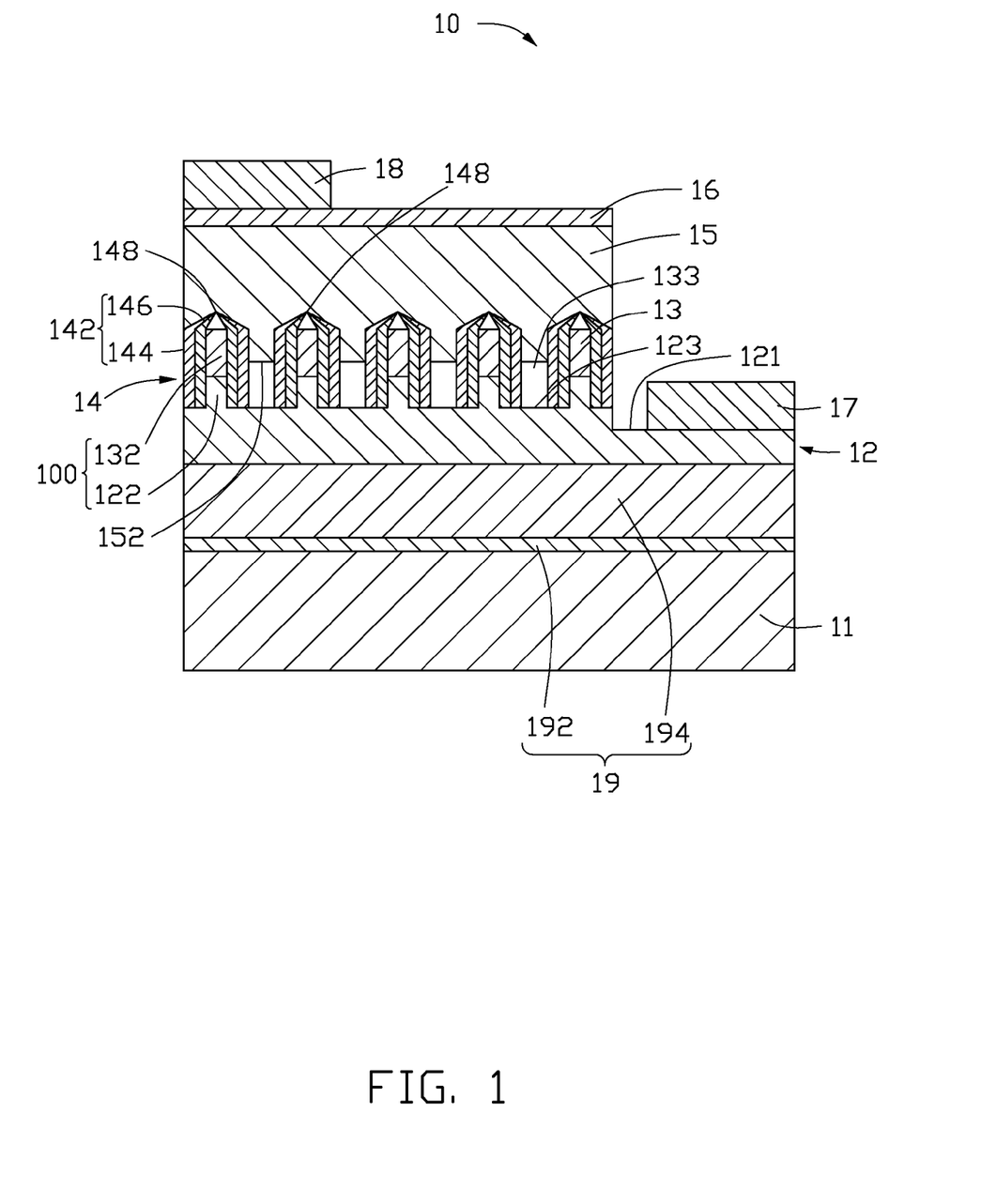
FIG. 1 is a cross sectional view of an LED chip in accordance with one embodiment of the present disclosure.
Figure 2:
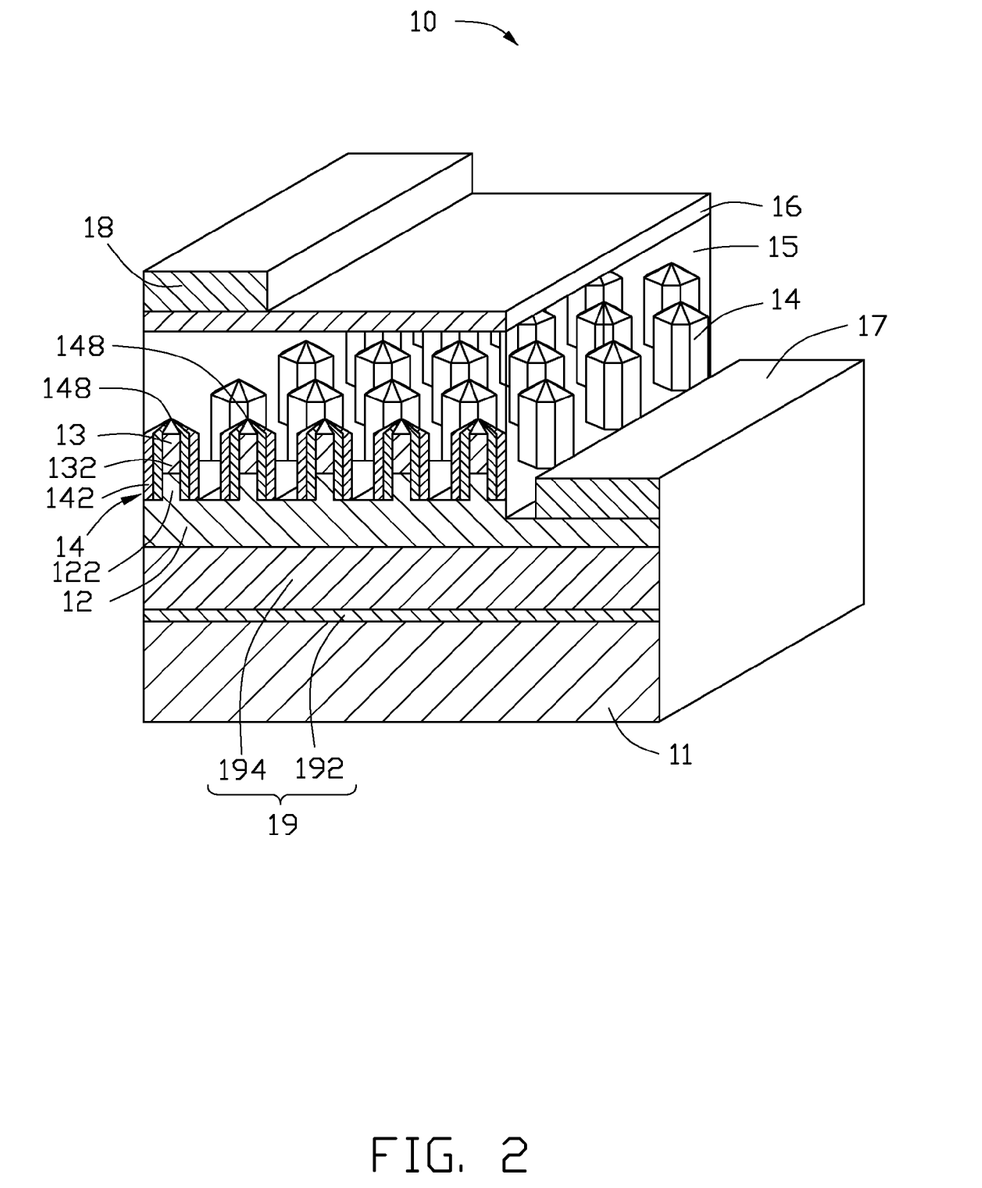
FIG. 2 is a partial cross sectional, three-dimensional view of the LED chip of FIG. 1.

Referring to FIG. 1 and FIG. 2, an LED chip 10 of one embodiment of the present disclosure includes a first semiconductor layer 12, a first light emitting layer 13 formed on the first semiconductor layer 12, a second light emitting layer 14 formed on the first light emitting layer 13, and a second semiconductor layer 15 formed on the second light emitting layer 14. The first light emitting layer 13 is configured to emit light having a first color. The second light emitting layer 14 is configured to emit light having a second color.

The LED chip 10 also includes a substrate 11. The substrate 11 is a sapphire substrate, a silicon substrate, a GaN substrate. Also referring to FIG. 7, a sapphire crystal includes a P1 plane, a P2 plane, a P3 plane and a P4 plane. In a preferred embodiment, the first semiconductor layer 12, a first light emitting layer 13, the second light emitting layer 14 and the second semiconductor layer 15 are formed on the P2 plane of the substrate 11 in series.

In this embodiment, the first semiconductor layer 12 is an N-semiconductor layer, and the second semiconductor layer 15 is a P-semiconductor layer. It can be understood that in other embodiment the first semiconductor layer 12 maybe a P-semiconductor layer, the second semiconductor layer 15 maybe an N-semiconductor layer in other embodiments. The first semiconductor layer 12 includes an exposed first surface 121 and a second surface 123 covered by the first light emitting layer 13, the second light emitting layer 14 and the second semiconductor layer 15. A bottom surface 152 of the second semiconductor layer 15 is spaced from the second surface 123 of the first semiconductor layer 12. The first light emitting layer 13, the second light emitting layer 14 and the second semiconductor layer 15 are formed on the second surface 123 in series. A plurality of first semiconductor monomers 122 is formed on the second surface 123. The first semiconductor monomers 122 are configured in a matrix arrangement, and are spaced evenly from each other. Each first semiconductor monomer 122 is cylindrical.

The first light emitting layer 13 is located between the first semiconductor layer 12 and the second light emitting layer 14. The second light emitting layer 14 is located between the first semiconductor layer 12 and the second semiconductor layer 15. The second light emitting layer 14 completely encloses the first light emitting layer 13 and contacts with the first light emitting layer 13. A light emitted from the first light emitting layer 13 and a light emitted from the second light emitting layer 15 are mixed to be a light with a color differed from the light emitted from the first light emitting layer 13 and the light emitted from the second light emitting layer 14. In this embodiment, the first light emitting layer 13 emits blue light, the second light emitting layer 14 emits green light. In at least one embodiment, the first light emitting layer 13 and the second light emitting layer 14 have a structure of multi-quantum well, and are made of $In_xGa_{1-x}N$ ($0 \leq x \leq 1$).

The first light emitting layer 13 includes a plurality of first light emitting monomers 132 formed on the first semiconductor monomer 122. The first light emitting monomers 132 are configured in a matrix arrangement, and are spaced evenly from each other. The second light emitting layer 14 includes a plurality of second light emitting monomers 142 configured in a matrix arrangement and being spaced evenly from each other. Each second light emitting monomer 142 respectively encloses a corresponding first light emitting monomer 132 and a corresponding first semiconductor monomer 122. A lateral part 144 of each second light emitting monomer 142 surrounds a periphery of a corresponding first light emitting monomer 132 and a periphery of a corresponding first semiconductor monomer 122. A top 146 of each second light emitting monomer 142 has a pyramid-shaped. A cross section of the top 146 of each second light emitting monomer 142 is a triangle. The second semiconductor layer covers on each of the second light emitting monomer 142.

Specifically, a vertice of the top 146 of each second light emitting monomer 142 forms a quantum dot 148, which emits a light with a color differed from the light emitted from the first light emitting layer 13 and the second light emitting layer 14.

Figure 6:
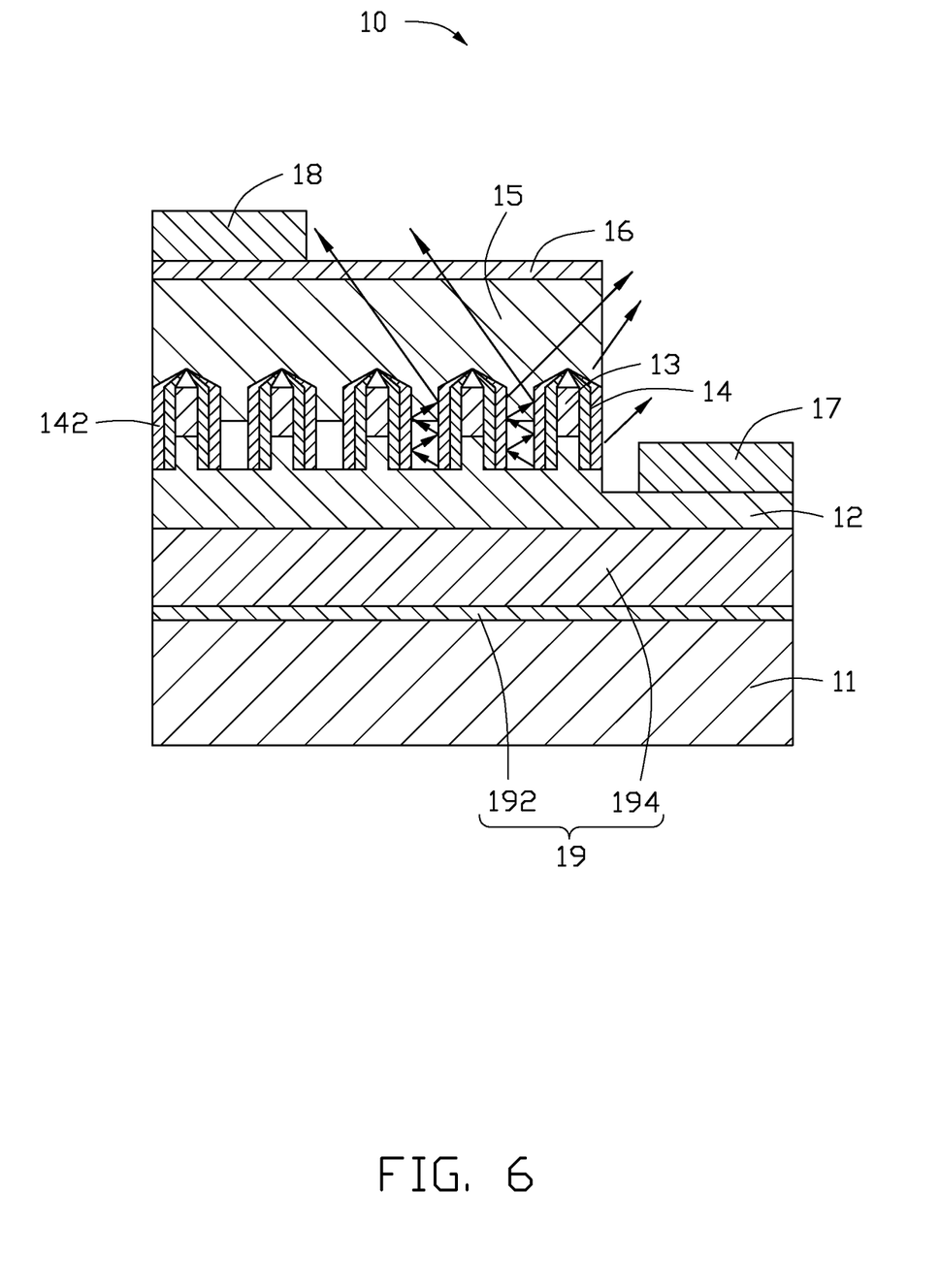
FIG. 6 is a light path diagram of the LED chip of FIG. 1.

Referring to the FIG. 6, light emitted from a bottom of each second light emitting monomer 142 is reflected by the second light emitting monomers 142, to exit from a side of the LED chip 10 to reduce the light loss, and improve the luminous efficiency.

Additionally, the LED chip 10 includes a transparent conductive layer 16 formed on the second semiconductor layer 15. In this embodiment, the transparent conductive layer 16 is made of indium tin oxide. Specifically, a first electrode 17 is formed on the first surface 121 of the first semiconductor layer 12, a second electrode 18 is formed on the transparent conductive layer 16. In this embodiment, the first electrode 17 is N electrode, the second electrode 18 is P electrode.

The LED chip 10 also includes a buffer layer 19 located between the substrate 11 and the first semiconductor layer 12. The buffer layer 19 includes a first buffer layer 192 and a second buffer layer 194. The first buffer layer 192 located between the substrate 11 and the second buffer layer 194. The first semiconductor layer 12 is located on the second buffer layer 194.

In this disclosure, the first light emitting layer 13 and the second light emitting layer 14 are both formed in the LED chip 10. So light with a first color emitted from the first light emitting layer 13 and light with a second color emitted from the second light emitting layer 14 are mixed sufficiently to be a light with a color differed from the first color and the second color. The LED chip 10 mixes the light perfectly and has a good color rendering.

Figure 3:
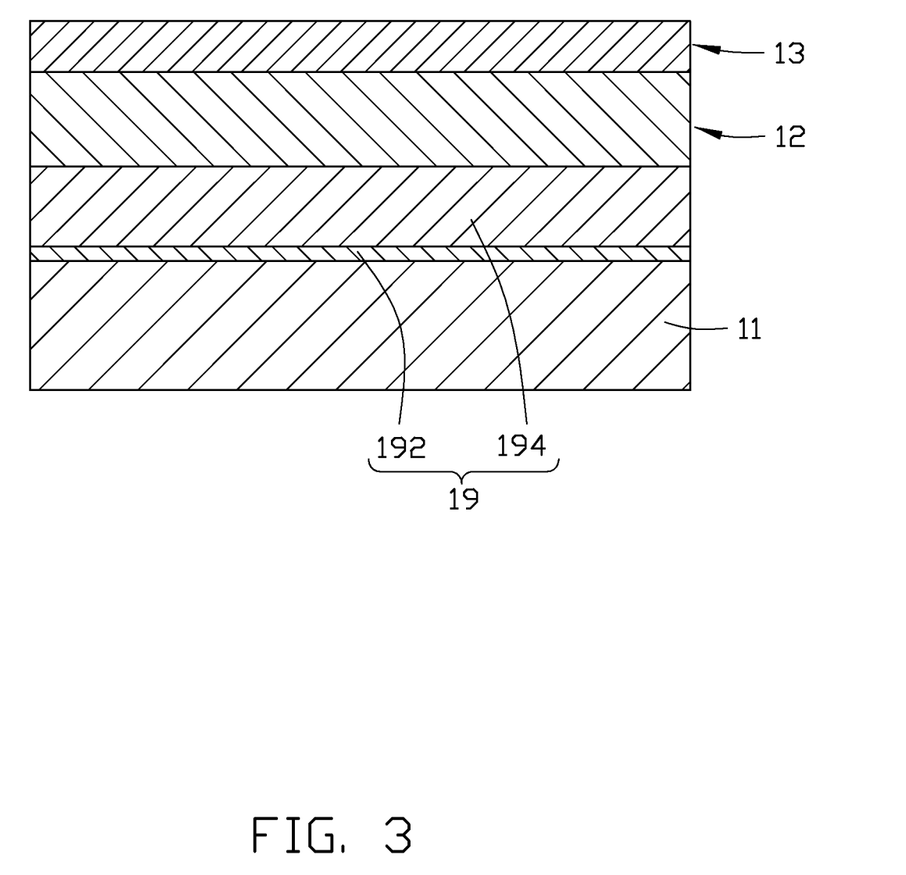
FIG. 3 is a cross sectional diagram of a first semiconductor layer and a first light emitting layer formed on a substrate.
Figure 4:
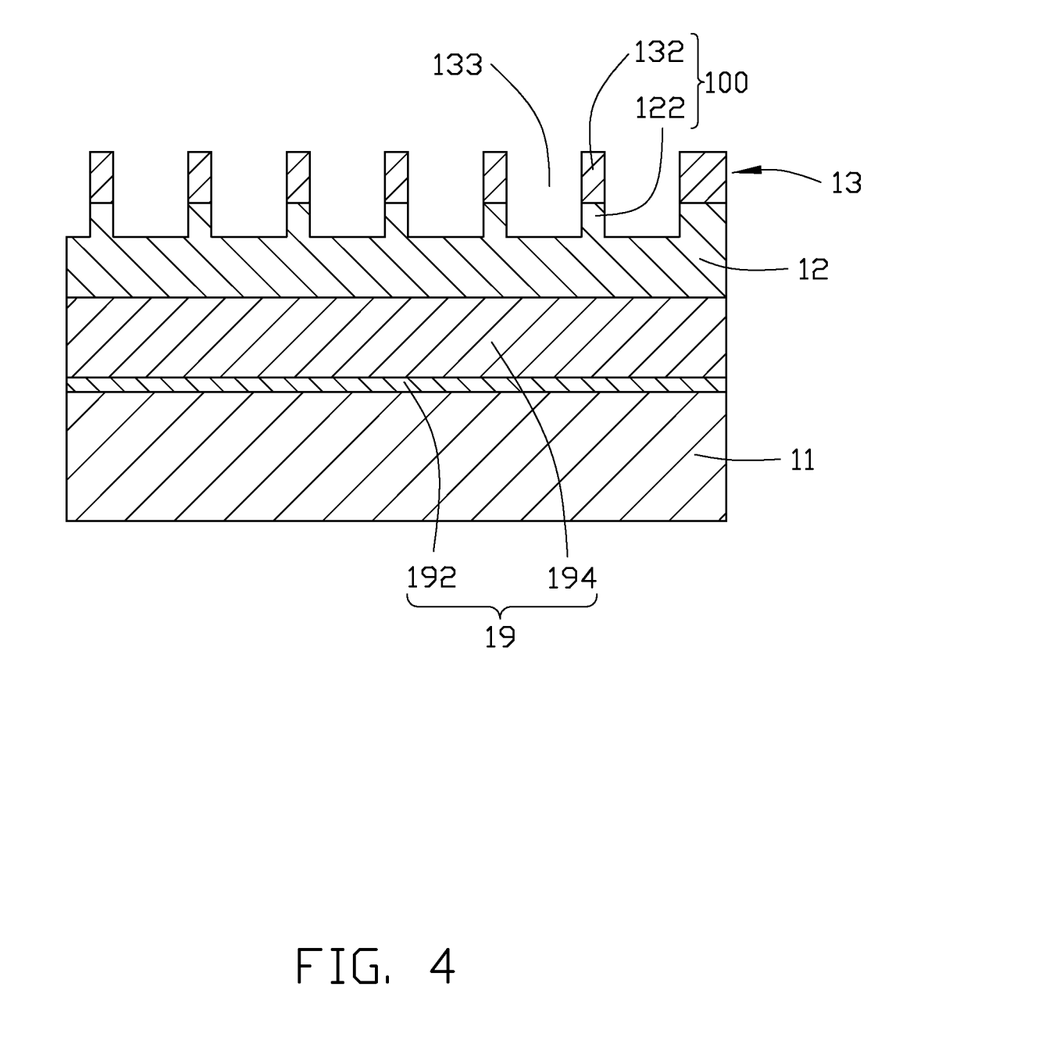
FIG. 4 is a cross sectional diagram of forming a plurality of cylinders by etching the first light emitting layer and the first semiconductor layer of the LED chip of FIG. 3.
Figure 5:
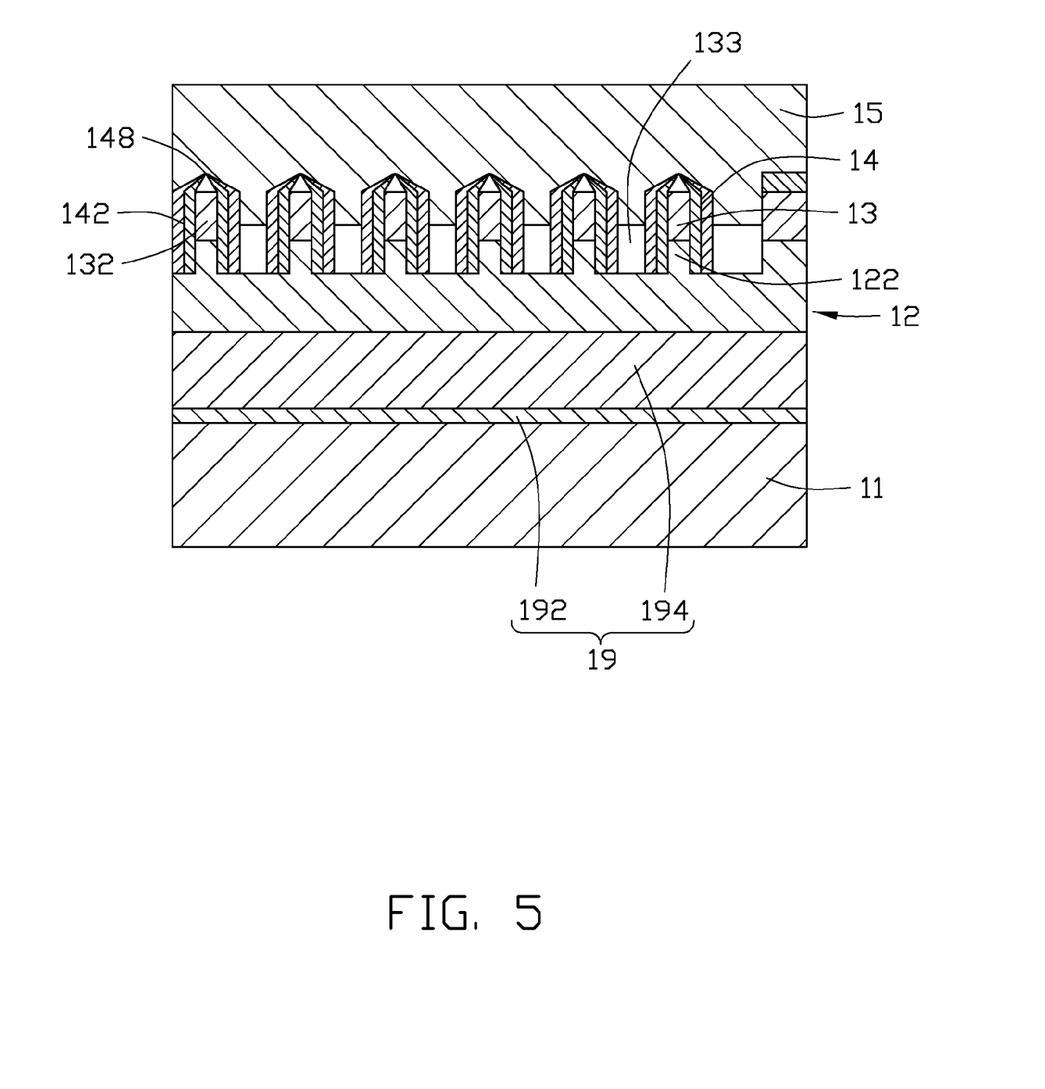
FIG. 5 is a cross sectional diagram of forming a second light emitting layer and a second semiconductor layer on the first light emitting layer and the first semiconductor layer of the LED chip of FIG. 4.

A method for manufacturing the LED chip 10 includes following steps:

Referring to FIG. 3, providing a substrate 11;

Forming a first semiconductor layer 12 on the substrate 11;

Referring to FIG. 4, forming a first light emitting layer 13 on the first semiconductor layer 12;

Referring to FIG. 5, forming a second light emitting layer 14 on the first light emitting layer 13;

Forming a second semiconductor layer 15 on the second light emitting layer 14.

Figure 7:
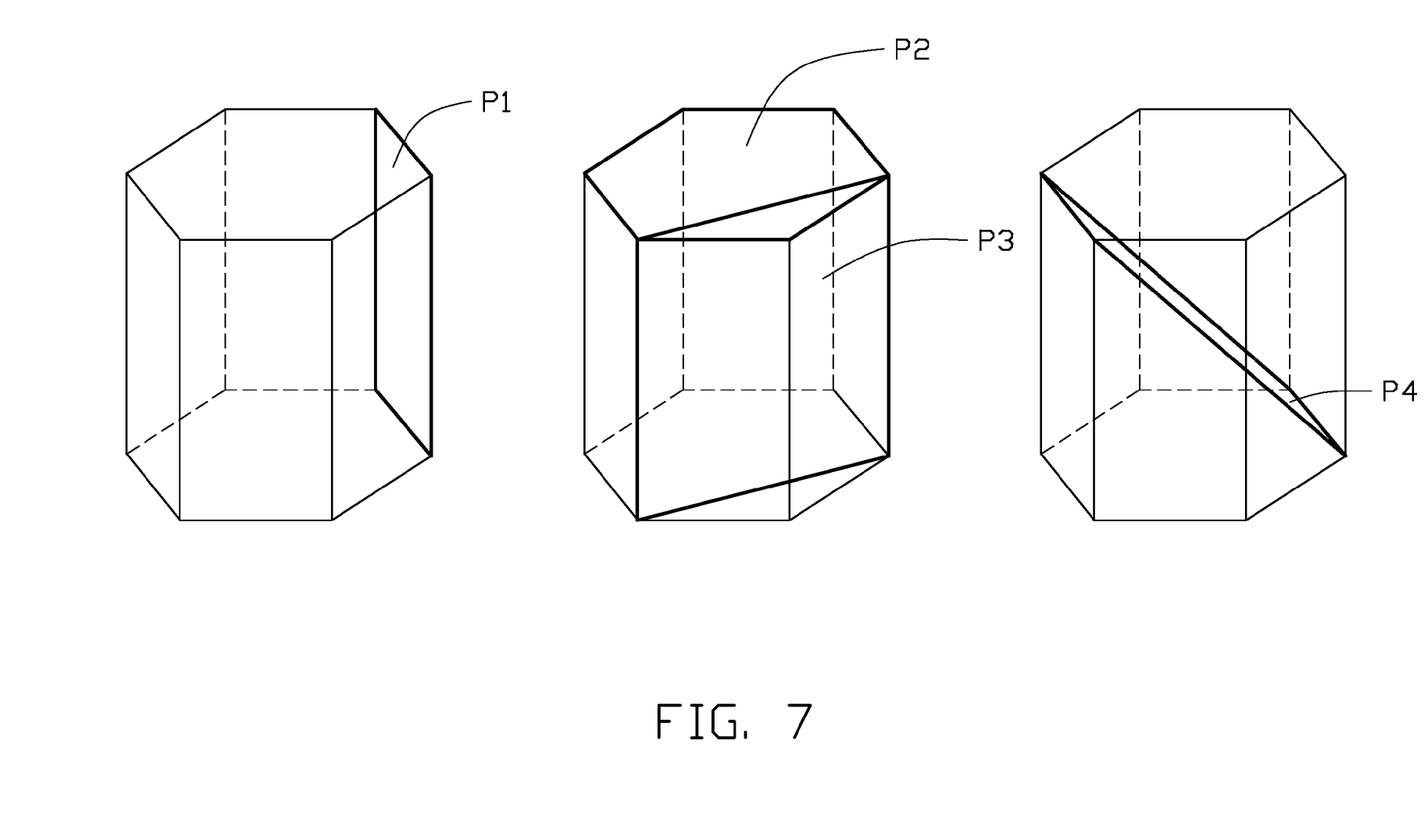
FIG. 7 is an isometric view of a sapphire crystal.

In above method for manufacturing the LED 10, The LED chip 10 also includes a substrate 11. The substrate 11 is a sapphire substrate, a silicon substrate, a GaN substrate. The sapphire crystal includes a P1 plane, a P2 plane, a P3 plane and a P4 plane. The first semiconductor layer 12, a first light emitting layer 13, a second light emitting layer 14 and the second semiconductor layer 15 are formed on the P2 plane of the substrate 11 by a way of chemical vapor deposition. The first semiconductor layer 12 formed on the P2 plane of the substrate 11 has a non-polar plane and a semi-polar plane. Under the environment of high temperature, the second light emitting layer 14 growths on the non-polar plane to prevent from the quantum confined stark effect to increase the chances of electrons and holes to be combined.

The method for manufacturing the LED chip 10 also includes a step of forming a plurality of cylinder 100. The cylinder 100 formed by etching the first light emitting layer 13 and the first semiconductor layer 12. The cylinders 100 are configured in a matrix arrangement and are spaced evenly from each other. A gap 133 is defined between each of the cylinder 100. A cross section of each cylinder 100 is a rectangular. Each cylinder 100 includes a corresponding first light emitting monomer 132 and a corresponding first semiconductor monomer 122. A height of each cylinder 100 is between 0.2-1 µm, the preferable height of each cylinder 100 is 0.5 µm. Each second light emitting monomer 142 covers a corresponding cylinder 100. A later part 144 of each second light emitting monomer 142 surrounds a periphery of a corresponding cylinder 100.

The method for the LED chip 10 also includes a step of forming a buffer layer 19 located between the substrate 11 and the first semiconductor layer 12, and forming a transparent conductive layer 16 on the second semiconductor layer 15. An N electrode 17 is formed on the first semiconductor layer 12, and a P electrode 18 formed on the transparent conductive layer 16.

It is to be further understood that even though numerous characteristics and advantages have been set forth in the foregoing description of embodiments, together with details of the structures and functions of the embodiments, the disclosure is illustrative only; and that changes may be made in the details, including in matters of shape, size, and arrangement of parts within the principles of the disclosure to the full extent indicated by the broad general meaning of the terms in which the appended claims are expressed.

The embodiments shown and described above are only examples. Many details are often found in the art such as the other features of LED chip and method of manufacturing same. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including the full extent established by the broad general meaning of the terms used in the claims. It will therefore be appreciated that the embodiments described above may be modified within the scope of the claims.

What is claimed is:

1. A light emitting diode (LED) chip comprising:
   a first semiconductor layer;
   a first light emitting layer formed on the first semiconductor layer and configured to emit a first light having a first color;
   a second light emitting layer formed on the first light emitting layer and configured to emit a second light having a second color; and
   a second semiconductor layer formed on the second light emitting layer;
   wherein the first semiconductor layer comprises an exposed first surface and a second surface enclosed by the first light emitting layer, the second light emitting layer and the second semiconductor.

2. The LED chip of claim 1, wherein the first light emitting layer is located between the first semiconductor layer and the second light emitting layer.

3. The LED chip of claim 1, wherein the second light emitting layer is located between the first semiconductor layer and the second semiconductor layer.

4. The LED chip of claim 1, wherein the second light emitting layer completely covers the first light emitting layer and contacts with the first light emitting layer.

5. The LED chip of claim 1, wherein the second semiconductor layer has a bottom surface spaced from the second surface.

6. The LED chip of claim 1, wherein a plurality of first semiconductor monomers is formed on the second surface.

7. The LED chip of claim 6, wherein the first semiconductor monomers are configured in a matrix arrangement, and are spaced from each other.

8. The LED chip of claim 6, wherein each first semiconductor monomer is cylindrical.

9. The LED chip of claim 6, wherein the first light emitting layer includes a plurality of first light emitting monomers formed on the first semiconductor monomer.

10. The LED chip of claim 9, wherein the first light emitting monomers are configured in a matrix arrangement and are spaced from each other.

11. The LED chip of claim 9, wherein the second light emitting layer includes a plurality of second light emitting monomers configured in a matrix arrangement and being spaced evenly from each other.

12. The LED chip of claim 11, wherein each second light emitting monomer respectively covers a corresponding first light emitting monomer and a corresponding first semiconductor monomer.

13. The LED chip of claim 11, wherein a lateral part of each second light emitting monomer surrounds a periphery of a corresponding first light emitting monomer and a periphery of a corresponding first semiconductor monomer.

14. The LED chip of claim 11, wherein a top of each second light emitting monomer has a pyramid-shaped, a vertice of the top of each second light emitting monomer forms a quantum dot, which emits a third light with a third color.

15. A method for manufacturing a LED chip, comprising:
providing a first semiconductor layer;
forming a first semiconductor layer on the substrate;
forming a first light emitting layer on the first semiconductor;
forming a second light emitting layer on the first light emitting layer;
forming a cylinder by etching the first light emitting layer and the first semiconductor, each cylinder includes a first light emitting monomer and a first semiconductor monomer; and
wherein the first semiconductor layer comprising an exposed first surface and a second surface enclosed by the first light emitting layer, the second light emitting layer and a second semiconductor layer.

16. The method of claim 15, wherein the substrate is a sapphire substrate, a silicon substrate, a GaN substrate, the first semiconductor layer, the first light emitting layer, the second light emitting layer and the second semiconductor layer are formed on a P2 plane of the substrate in series.

17. The method of claim 16, wherein the first semiconductor layer formed on the P2 plane of the substrate has a non polar plane and a semi-polar plane, the second light emitting layer growths on the non-polar plane.

* * * * *